United States Patent
Liu et al.

(10) Patent No.: US 8,804,407 B1
(45) Date of Patent: Aug. 12, 2014

(54) PMOS PASS GATE

(75) Inventors: Jun Liu, Milpitas, CA (US); Albert Ratnakumar, San Jose, CA (US); Irfan Rahim, Milpitas, CA (US); Qi Xiang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 492 days.

(21) Appl. No.: 13/181,219

(22) Filed: Jul. 12, 2011

(51) Int. Cl.
*G11C 11/00* (2006.01)

(52) U.S. Cl.
USPC ............................................ 365/156; 365/63

(58) Field of Classification Search
CPC ....... G11C 11/417; G11C 11/419; G11C 8/16
USPC .................................................. 365/156, 63
See application file for complete search history.

(56) References Cited

U.S. PATENT DOCUMENTS

| | | | |
|---|---|---|---|
| 4,856,106 A | 8/1989 | Teraoka | |
| 5,548,228 A | 8/1996 | Madurawe | |
| 5,596,524 A * | 1/1997 | Lin et al. | 365/185.1 |
| 5,719,507 A * | 2/1998 | Mehrotra | 326/113 |
| 6,188,628 B1 | 2/2001 | Tomotani | |
| 6,233,177 B1 * | 5/2001 | Shokouhi et al. | 365/185.23 |
| 6,624,459 B1 | 9/2003 | Dachtera et al. | |
| 7,292,065 B2 | 11/2007 | Lui et al. | |
| 7,639,557 B1 * | 12/2009 | Chou et al. | 365/230.05 |
| 8,023,348 B2 * | 9/2011 | Kohler et al. | 365/201 |
| 8,284,600 B1 * | 10/2012 | Poplevine et al. | 365/185.05 |
| 2005/0207210 A1 | 9/2005 | Barth et al. | |
| 2006/0187700 A1 | 8/2006 | Ho | |
| 2007/0025162 A1 * | 2/2007 | Deng et al. | 365/189.09 |
| 2009/0109785 A1 * | 4/2009 | Houston et al. | 365/226 |
| 2010/0238728 A1 * | 9/2010 | Leung | 365/185.08 |
| 2010/0296333 A1 | 11/2010 | Houston | |
| 2011/0157964 A1 | 6/2011 | McPartland et al. | |

\* cited by examiner

*Primary Examiner* — Tuan T Nguyen
(74) *Attorney, Agent, or Firm* — Mauriel Kapouytian Woods LLP; Ararat Kapouytian

(57) ABSTRACT

An IC that includes a memory cell and a pass gate coupled to the memory cell, where the pass gate includes a PMOS transistor, is described. In one implementation, the PMOS transistor has a negative threshold voltage. In one implementation, the memory cell includes thick oxide transistors.

20 Claims, 3 Drawing Sheets

100

PMOS PASS GATE

BACKGROUND

Programmable logic devices (PLDs) (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) are well-known integrated circuits (ICs) that provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Placing new data into the configuration elements programs or reprograms the PLD's logic functions and associated routing pathways. Configuration elements that are field programmable are often implemented as random access memory (RAM) cells, which in PLDs are sometimes referred to as "configuration RAM." Configuration RAMs are generally implemented as a 6-transistor static RAM (6T-SRAM). Thus, configuration RAMs generally refer to SRAM.

Configuration RAMs are generally coupled to pass gates. The configuration RAMs along with the pass gates are used to configure a look up table (LUT) or to connect interconnect lines used for routing in the PLD. The pass gates are n-channel metal oxide semiconductor (NMOS) transistors.

SUMMARY

P-channel metal oxide semiconductor (PMOS) transistors fabricated using previous generations of fabrication process nodes are considered weaker than NMOS transistors in terms of drain current (Id). Moreover, bias temperature and instability (BTI) shifts in threshold voltage (Vt) are greater for PMOS transistors than for NMOS transistors. As a result, NMOS transistors, rather than PMOS transistors, are used as pass gates.

Furthermore, PMOS pass gates involve the use of transistors with negative Vt or application of a negative bias. Transistors with negative Vt have greater process variability than transistors with non-negative Vt. The application of a negative bias involves use of a larger charge pump die area or an external negative voltage source. For this additional reason, use of PMOS transistors as pass gates is discouraged.

Despite these apparent disadvantages, embodiments of the present invention use a PMOS transistor, rather than an NMOS transistor, as a pass gate. Relative to a comparable NMOS pass gate, a PMOS pass gate, particularly one fabricated at a process node of 32 nanometers (nm) or less, has a higher drain current of the pass gate (Idpg) and a higher maximum gate voltage (Vmax). Additionally, relative to an NMOS pass gate, a PMOS pass gate has a smaller Gamma value (which is a measure of the body effect) due to lower well doping in the PMOS pass gate than the NMOS pass gate. Additionally, using PMOS pass gates allows for avoiding use of well separations between the pass gates and PMOS transistors of the memory cells. This allows for using less die area for the memory array. Furthermore, using PMOS pass gates allows for reducing or eliminating transient currents in routing lines when the IC device enters user mode. This is because with PMOS pass gates, the routing lines can be at ground potential during IC device loading. On the other hand, with NMOS pass gates, the routing lines have to switch from Vcc to ground potential during IC device loading.

In one aspect, an embodiment of the present invention provides an IC that includes a memory cell and a pass gate coupled to the memory cell, where the pass gate includes a PMOS transistor. Also, in one embodiment, the PMOS transistor has a negative threshold voltage. In one embodiment, the memory cell includes thick oxide transistors.

BRIEF DESCRIPTION OF THE DRAWINGS

The novel features of the invention are set forth in the appended claims. However, for purpose of explanation, several aspects of a particular embodiment of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
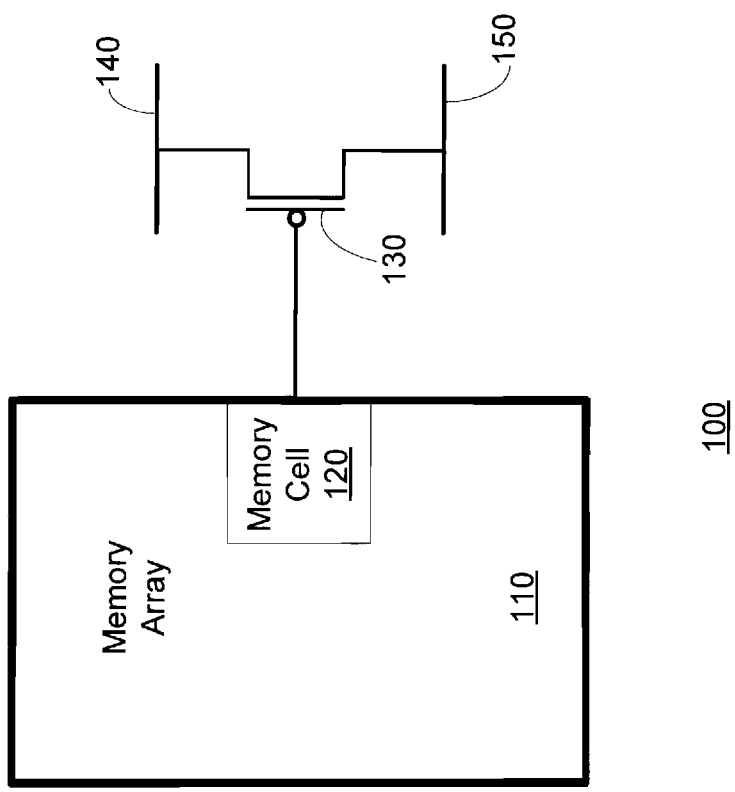
FIG. 1 is a block diagram of one embodiment of an IC of the present invention.

FIG. 1 is a block diagram of one embodiment of an IC of the present invention. In FIG. 1, IC 100 includes memory array 110, pass gate 130, first line 140 and second line 150. Memory array 110 includes a plurality of memory cells, but only one, memory cell 120, is shown in FIG. 1. Similarly, IC 100 includes a plurality of pass gates, but only one, pass gate 130, is shown in FIG. 1. In one embodiment, memory array 110 is a configuration RAM.

As noted above, pass gate 130 is coupled to lines 140 and 150. In one embodiment, pass gate 130 is a routing pass gate. In one embodiment, pass gate 130 can be used, for example, to configure a LUT by connecting lines therein or to connect two interconnect lines used for routing in the IC device. In one embodiment, the interconnect lines are used for global routing in the IC device. In another embodiment, the interconnect lines are used for local routing in the IC device. When pass gate 130 is used to connect interconnect lines, lines 140 and 150 may represent interconnect lines. When pass gate 130 is used to configure a LUT, lines 140 and 150 may represent lines of the LUT.

Pass gate 130 is a PMOS transistor. In one embodiment, pass gate 130 (which may also herein be referred to as PMOS pass gate 130) is a thin oxide, general usage (G type), PMOS transistor. In one embodiment, the thin oxide thickness is 10 Angstroms (Å). It is to be noted as used herein a specific parameter value is not intended to be limited to exactly that specific parameter value but to also encompass approximations of that specific parameter value. For example, 10 Å is intended to include approximately 10 Å. In one embodiment, PMOS pass gate 130 is low voltage threshold (LVT) PMOS transistor. In one embodiment, the LVT is 20 mV or less. In one embodiment, PMOS pass gate 130 is made using a 32 nm or finer scale fabrication process node. In one embodiment, PMOS pass gate 130 is made using a 28 nm or 20 nm fabrication process node.

Figure 2:
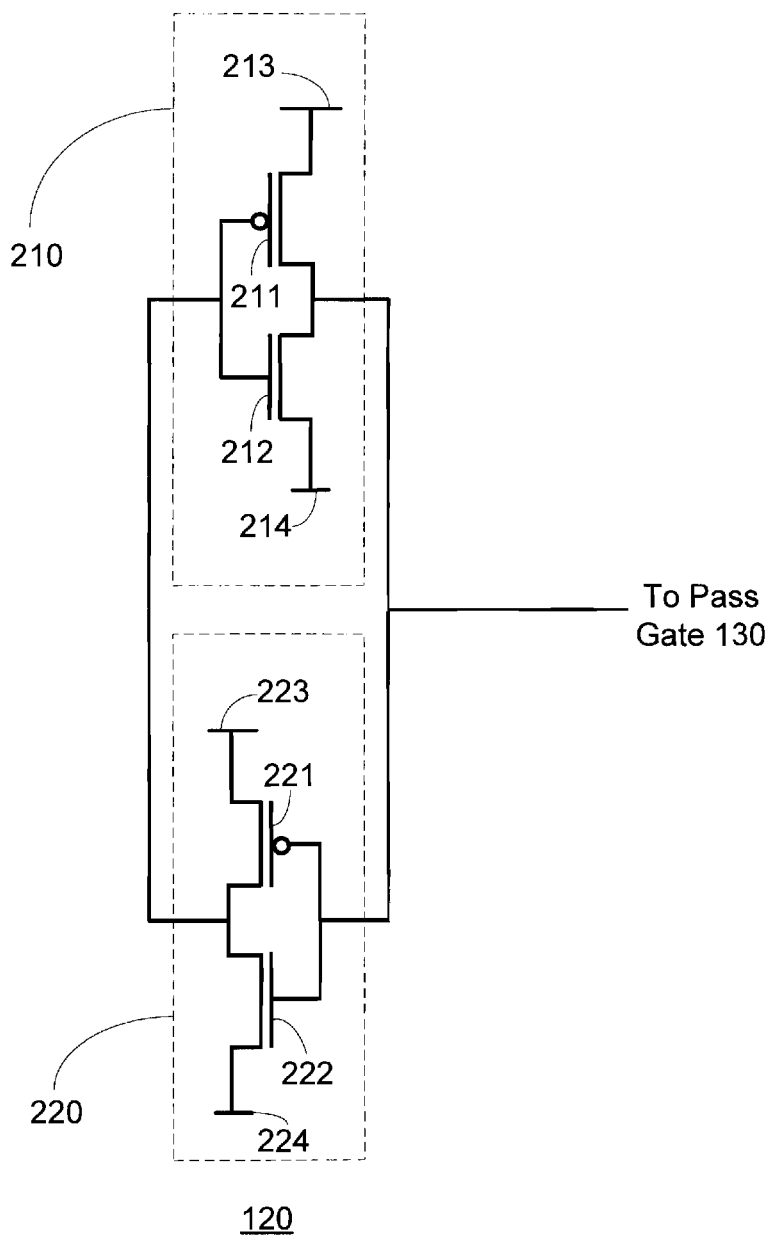
FIG. 2 is a detailed diagram of the memory cell shown in FIG. 1.

FIG. 2 is a detailed diagram of one embodiment of the memory cell shown in FIG. 1. More specifically, FIG. 2 shows details of the inverters in the memory cell. Memory cell 120 is a latch type memory cell and includes inverters 210 and 220 coupled as shown. In one embodiment, each of inverters 210 and 220 is a complementary metal oxide semiconductor (CMOS) inverter, which includes a PMOS transistor and an NMOS transistor coupled in series. Inverter 210 includes PMOS transistor 211 and NMOS transistor 212. Similarly, inverter 220 includes PMOS transistor 221 and NMOS transistor 222. In one embodiment, NMOS transistors 212, 222 and PMOS transistors 211, 221 are thick gate oxide (TGO) transistors. In one embodiment the thick gate oxide thickness is 60 Å. In addition to inverters 210 and 220, memory cell 120 may include other components not shows in FIG. 2.

In one embodiment, PMOS pass gate 130 has a negative threshold voltage. Table 1 below summarizes some of the relevant data for such an embodiment and shows the corresponding data for an NMOS pass gate.

TABLE 1

| Pass Gate Type | Vg_ON | Vg_OFF | Idoff (leakage) | Overdrive Voltage | Idpg |
|---|---|---|---|---|---|
| NMOS | 0.94 volts (V) | 0 V | 1x | 0.54 V | 1x |
| PMOS | 0 V | 1.04 V | 1x | 0.64 V | 2x |

The data in Table 1 is based on a Vcc of 0.8 V and source voltage Vs of 0.4 V applied to the source terminal of the pass gate. Also, the data in Table 1 is for a PMOS pass gate that has a Vt of −0.24 V, a gate length of 0.022 micrometers (μm), and is fabricated using a 20 nm process node. Similarly, the data in Table 1 is for an NMOS pass gate that has a Vt of 20 mV, a gate length of 0.022 μm, and is fabricated using a 20 nm process node.

As can be seen in Table 1, for the NMOS pass gate, the ON gate voltage Vg_ON is 0.94 V, the OFF gate voltage Vg_OFF is 0 V, the overdrive voltage is 0.54 V, the leakage current Idoff is 1X, and the drain current Idpg is 1Y. The overdrive voltage is equal to Vgs−Vt, where Vgs represents the voltage difference between the gate and source terminals of a transistor. The overdrive voltage is also known as the excess gate voltage or effective voltage. For the PMOS pass gate, the ON gate voltage Vg_ON is 0 V, the OFF gate voltage Vg_OFF is 1.04 V, the overdrive voltage is 0.64 V, the leakage current Idoff is 1X, and the drain current Idpg is 2Y. Thus, the PMOS pass gate provides a higher overdrive voltage (more specifically 100 millivolts (mV) higher) than the comparable NMOS pass gate. The drain current of the PMOS pass gate is twice as large as that of the NMOS pass gate. The leakage current (which in Table 1 refers to the substrate leakage current) is the same for both the PMOS and NMOS pass gates. Therefore, the higher overdrive voltage and higher drain current of the PMOS pass gate relative to the NMOS pass gate is achieved without an increased leakage current.

In such an embodiment, when the gate voltage of PMOS pass gate 130 is 0 V or lower, PMOS pass gate 130 is ON and creates an electrical coupling between lines 140 and 150. On the other hand, when the gate voltage of PMOS pass gate 130 is 1.04 V or higher, PMOS pass gate 130 is OFF and lines 140 and 150 are not electrically coupled via PMOS pass gate 130. Also, in such an embodiment, terminals 213 and 223 of PMOS transistors 211 and 221, respectively, are coupled to a supply voltage of Vcc minus Vt, where Vt is the threshold voltage of PMOS pass gate 130. In one embodiment, Vcc is 0.8 V and Vt is −0.24 V. In such an embodiment, terminals 213 and 223 are at 1.04 V. Also, in such an embodiment, terminals 214 and 224 of NMOS transistors 212 and 222, respectively, are at 0 V.

In another embodiment, PMOS pass gate 130 has a non-negative threshold voltage. In one such embodiment, PMOS pass gate 130 is a standard PMOS transistor. Table 2 below summarizes some of the relevant data for such an embodiment and shows the corresponding data for an NMOS pass gate.

TABLE 2

| Pass Gate Type | Vg_ON | Vg_OFF | Idoff (leakage) | Overdrive Voltage | Idpg |
|---|---|---|---|---|---|
| NMOS | 0.94 V | 0 V | 1x | 0.54 V | 1x |
| PMOS | −0.24 V | 0.8 V | 1x | 0.64 V | 2x |

The data in Table 2 is based on a Vcc of 0.8 V and source voltage Vs of 0.4 V applied to the source terminal of the pass gate. Also, the data in Table 2 is for a PMOS pass gate that has a Vt of 0 V, a gate length of 0.022 μm, and is fabricated using a 20 nm process node. Similarly, the data in Table 2 is for an NMOS pass gate has a Vt of 20 mV, a gate length of 0.022 μm, and is fabricated using a 20 nm process node.

As can be seen in Table 2, for the NMOS pass gate, the ON gate voltage Vg_ON is 0.94 V, the OFF gate voltage Vg_OFF is 0 V, the overdrive voltage is 0.54 V, the leakage current Idoff is 1X, and the drain current Idpg is 1Y. On the other hand, for the PMOS pass gate, the ON gate voltage Vg_ON is −0.24 V, the OFF gate voltage Vg_OFF is 0.8 V, the overdrive voltage is 0.64 V, the leakage current Idoff is 1X, and the drain current Idpg is 2Y. Thus, the PMOS pass gate provides a higher overdrive voltage (more specifically 100 mV higher) than the comparable NMOS pass gate. The drain current of the PMOS pass gate is twice as large as that of the NMOS pass gate. The leakage current (which in Table 2 refers to the substrate leakage current) is the same for both the PMOS and NMOS pass gates. Thus, the higher overdrive voltage and higher drain current of the PMOS pass gate relative to the NMOS pass gate is achieved without an increased leakage current.

In such an embodiment, when the gate voltage of PMOS pass gate 130 is −0.24 V or lower, PMOS pass gate 130 is ON and creates an electrical coupling between lines 140 and 150. On the other hand, when the gate voltage of PMOS pass gate 130 is 0.8 V or higher, PMOS pass gate 130 is OFF and lines 140 and 150 are not electrically coupled via PMOS pass gate 130. Also, in such an embodiment, terminals 213 and 223 of PMOS transistor 211 and 221, respectively, are coupled to a supply voltage of Vcc, which in one embodiment is 0.8 V. Also, in such an embodiment, terminals 214 and 224 of NMOS transistor 212 and 222, respectively, are at −0.24 V.

In one embodiment, the negative supply voltage (such as that applied to the CMOS inverters of memory cell 120) is generated internally by the IC using a charge pump. In another embodiment, the negative supply voltage is supplied from outside of the IC.

Figure 3:
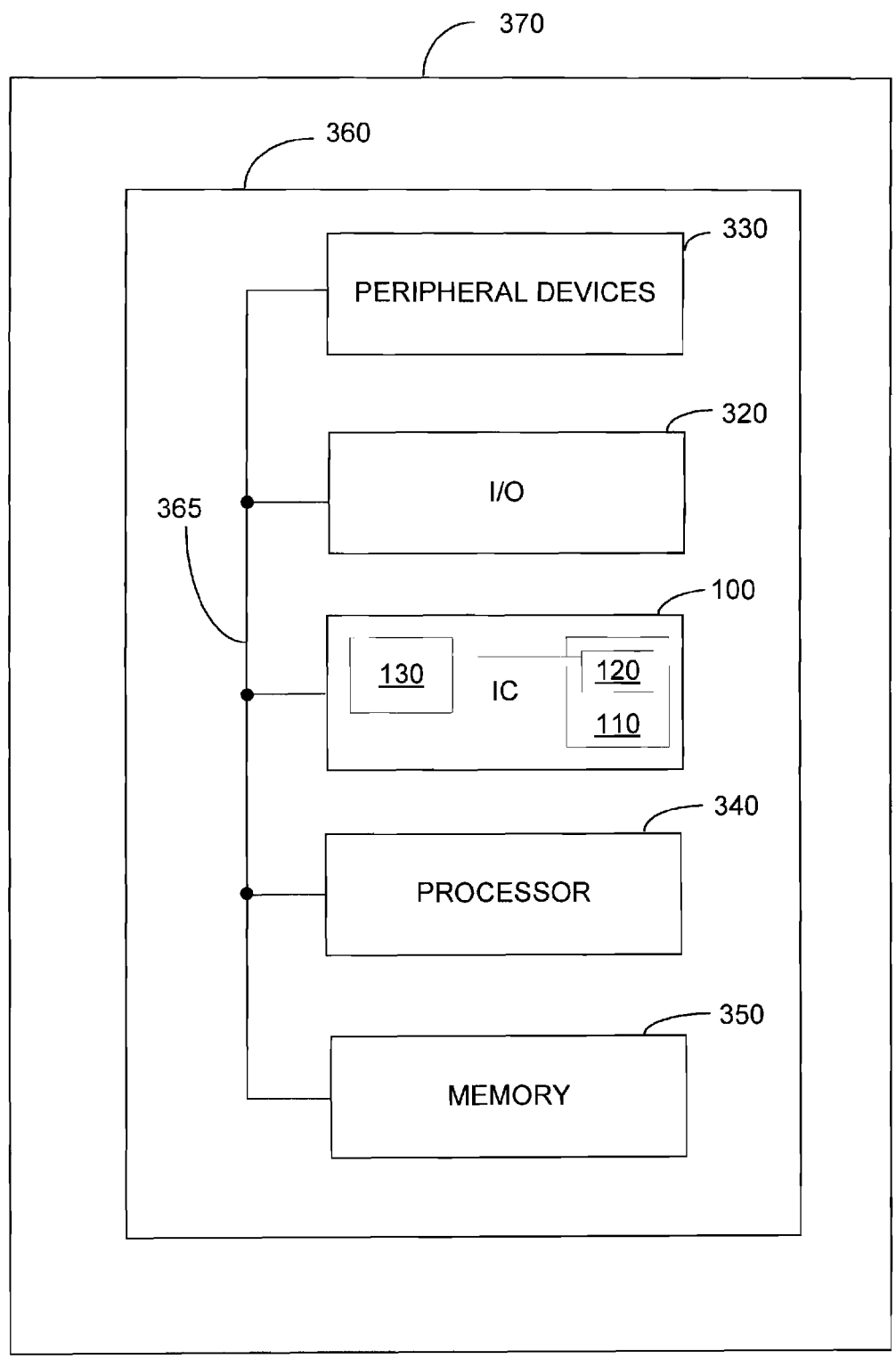
FIG. 3 illustrates an exemplary data processing system including an exemplary IC in which pass gates in accordance with embodiments of the present invention might be implemented.

FIG. 3 illustrates an exemplary data processing system including an exemplary IC in which pass gates in accordance with embodiments of the present invention might be implemented. FIG. 3 illustrates, by way of example, IC 100 in data processing system 300. In one embodiment, IC 100 is a PLD. As described with reference to FIG. 1, IC 100 includes a memory array 110, a memory cell 120 in memory array 110, and a PMOS pass gate 130 coupled to memory cell 120. In one embodiment, memory array 110, memory cell 120 and PMOS pass gate 130 are on the same die/chip as IC 100. In one embodiment, IC 100 may include a plurality of memory arrays such as memory array 110 (but only one such memory array is shown to avoid overcomplicating the drawing). Similarly, in one embodiment, memory array 110 includes a plurality of memory cells such as memory cell 120 and PMOS pass gates such as PMOS pass gate 130 (but only one such memory cell and only one such PMOS pass gate are shown to avoid overcomplicating the drawing).

Data processing system 300 may include one or more of the following components: processor 340, memory 350, input/output (I/O) circuitry 320, and peripheral devices 330. These components are coupled together by system bus 365 and are populated on circuit board 360 which is contained in end-user system 370. A data processing system such as system 300 may include a single end-user system such as end-user system 370 or may include a plurality of systems working together as a data processing system.

System 300 can be used in a wide variety of applications, such as computer networking, data networking, instrumentation, video processing, digital signal processing ("DSP"), or any other application where the advantage of using programmable or reprogrammable logic is desirable. IC 100 can be used to perform a variety of different logic functions. For example, IC 100 can be configured as a processor or controller that works in cooperation with processor 340 (or, in alternative embodiments, IC 100 might itself act as the sole system processor). IC 100 may also be used as an arbiter for arbitrating access to shared resources in system 300. In yet another example, IC 100 can be configured as an interface between processor 340 and one of the other components in system 300. It should be noted that system 300 is only exemplary.

In one embodiment, system 300 is a digital system. As used herein a digital system is not intended to be limited to a purely digital system, but also encompasses hybrid systems that include both digital and analog subsystems.

In one embodiment, at the 10 year time to device breakdown (TDDB), the stress voltage for a PMOS pass gate is 200 mV greater than that for an NMOS pass gate. In other words, a PMOS pass gate can tolerate a stress voltage that is 200 mV greater than that which can be tolerated by an NMOS pass gate. This is due to (1) the thicker oxide layer under inversion condition for the PMOS transistor than the NMOS transistor and (2) the different charge injection mechanisms used in the PMOS transistor versus the NMOS transistor. Additionally, the PMOS pass gate has a much lower stress induced leakage current (SLIC) than an NMOS pass gate as the PMOS transistor has a higher valence band off set. A higher barrier voltage results in a lower leakage current, which in turn allows for a higher Vmax.

With a smaller scale fabrication process node, the drain current in the linear mode for PMOS pass gates increases, whereas that of the NMOS pass gates remains relatively constant. Also, the Gamma value for a PMOS pass gate is lower than that for a comparable NMOS pass gate as the PMOS pass gate has a lower well doping than the NMOS pass gate. A lower Gamma value is directly related to the bulk leakage current. As a result, the bulk leakage current is lower for a PMOS pass gate than an NMOS pass gate. Moreover, a lower Gamma value results in a faster pass gate speed.

In one embodiment, as the pass gate is a PMOS pass gate and it is coupled to PMOS transistors in the memory cell, e.g., PMOS transistors of the CMOS inverter, there is no need to have a well separation between the PMOS pass gate and the PMOS transistors of the memory cell. By contrast, an NMOS pass gate is separated by the PMOS transistors of the memory cell by well separations. Avoiding use of the above well separations in embodiments of the present invention reduces the required die area. In one embodiment, this provides an approximately 10% area savings in the memory array.

In one embodiment, at a process node of 28 nanometers, the Idpg for a PMOS pass gate is approximately 1.7 times as large as that for a comparable NMOS pass gate. Under such conditions, after 11 years at 100° Celsius, the BTI Vt shifts by 20 mV more for a PMOS pass gate than an NMOS pass gate.

Furthermore, using PMOS pass gates allows for reducing or eliminating transient currents in routing lines when the IC device enters user mode. This is because with PMOS pass gates the routing lines can be at ground potential during IC device loading. By contrast, with NMOS pass gates the routing lines have to switch from Vcc to ground potential during IC device loading.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An integrated circuit (IC) comprising:
a memory cell; and
a pass gate coupled to the memory cell, wherein the pass gate comprises a p-channel metal oxide semiconductor (PMOS) transistor.

2. The IC of claim 1, wherein the PMOS transistor has a negative threshold voltage.

3. The IC of claim 1, wherein the PMOS transistor has a non-negative threshold voltage, a negative bias voltage is applied to the memory cell, and a negative gate voltage causes the pass gate to be in an ON state.

4. The IC of claim 1, wherein the memory cell is coupled to a gate of the pass gate and data stored in the memory cell controls a state of the pass gate.

5. The IC of claim 1, wherein the pass gate is a routing pass gate.

6. The IC of claim 1, wherein the memory cell includes a first inverter and a second inverter coupled to the first inverter, wherein each of the first and second inverters is a complementary metal oxide semiconductor (CMOS) inverter including a n-channel metal oxide semiconductor (NMOS) transistor coupled in series to a PMOS transistor, and wherein the NMOS transistor and the PMOS transistor of the CMOS inverter are thick oxide transistors.

7. The IC of claim 1 further comprising:
a configuration random access memory (RAM), wherein the configuration RAM includes the memory cell.

8. The IC of claim 1, wherein there is no well separation between transistors in the memory cell and the PMOS transistor of the pass gate.

9. The IC of claim 1, wherein the pass gate is coupled between a first line and a second line of a look up table (LUT).

10. The IC of claim 1, wherein the pass gate is coupled between a first interconnect line and a second interconnect line of the IC.

11. The IC of claim 1, wherein the IC is a programmable logic device.

12. A digital system comprising the IC of claim 1.

13. An integrated circuit (IC) comprising:
   a configuration random access memory (RAM), wherein the configuration RAM includes a memory cell; and
   a pass gate coupled to the memory cell, wherein the pass gate is a routing pass gate and comprises a p-channel metal oxide semiconductor (PMOS) transistor, further wherein the memory cell is coupled to a gate of the pass gate and data stored in the memory cell determines a state of the pass gate.

14. The IC of claim 13, wherein the PMOS transistor has a negative threshold voltage.

15. The IC of claim 13, wherein the memory cell includes a first inverter and a second inverter coupled to the first inverter, wherein each of the first and second inverters is a complementary metal oxide semiconductor (CMOS) inverter including a n-channel metal oxide semiconductor (NMOS) transistor coupled in series to a PMOS transistor, and wherein the NMOS transistor and the PMOS transistor of the CMOS inverter are thicker oxide transistors.

16. The IC of claim 13, wherein the pass gate is coupled between a first interconnect line and a second interconnect line of the IC.

17. An integrated circuit (IC) comprising:
   a configuration random access memory (RAM), wherein the configuration RAM includes a memory cell, wherein the memory cell includes a first inverter and a second inverter coupled to the first inverter, wherein each of the first and second inverters is a complementary metal oxide semiconductor (CMOS) inverter including a n-channel metal oxide semiconductor (NMOS) transistor coupled in series to a p-channel metal oxide semiconductor (PMOS) transistor; and
   a pass gate coupled to the memory cell, wherein the pass gate is a routing pass gate and comprises a PMOS transistor, further wherein the memory cell is coupled to a gate of the pass gate and data stored in the memory cell determines a state of the pass gate, further wherein the PMOS transistor of the pass gate has a negative threshold voltage.

18. The IC of claim 17, wherein the pass gate is coupled between a first interconnect line and a second interconnect line of the IC.

19. The IC of claim 17, wherein the pass gate is coupled between a first line and a second line of a look up table (LUT).

20. The IC of claim 17, wherein the IC is a programmable logic device.

* * * * *